US007740946B2

(12) United States Patent
Morimoto et al.

(10) Patent No.: US 7,740,946 B2
(45) Date of Patent: Jun. 22, 2010

(54) ELECTROCONDUCTIVE LAMINATE, AND ELECTROMAGNETIC WAVE SHIELDING FILM FOR PLASMA DISPLAY AND PROTECTIVE PLATE FOR PLASMA DISPLAY

(75) Inventors: Tamotsu Morimoto, Ichihara (JP); Masato Kawasaki, Ichihara (JP); Makoto Hiramoto, Ichihara (JP); Koichi Kanda, Takasago (JP); Susumu Nakagama, Takasago (JP)

(73) Assignee: Asahi Glass Company, Limited, Tokyo (JP)

( * ) Notice: Subject to any disclaimer, the term of this patent is extended or adjusted under 35 U.S.C. 154(b) by 37 days.

(21) Appl. No.: 11/839,839

(22) Filed: Aug. 16, 2007

(65) Prior Publication Data

US 2007/0298265 A1    Dec. 27, 2007

Related U.S. Application Data

(63) Continuation of application No. PCT/JP2006/302770, filed on Feb. 16, 2006.

(30) Foreign Application Priority Data

Feb. 17, 2005    (JP) ............................. 2005-040384

(51) Int. Cl.
  *B32B 9/00*    (2006.01)
(52) U.S. Cl. ..................... 428/432; 428/434; 428/701; 428/702
(58) Field of Classification Search ........................ None
  See application file for complete search history.

(56) References Cited

U.S. PATENT DOCUMENTS 5,837,361 A    11/1998    Glaser et al.

6,316,110 B1 *    11/2001    Anzaki et al. ............... 428/432
2003/0012963 A1    1/2003    Ebisawa et al.

FOREIGN PATENT DOCUMENTS

JP    8-32436    3/1996

(Continued)

OTHER PUBLICATIONS

U.S. Appl. No. 11/970,097, Jan. 7, 2008, Morimoto, et al.

(Continued)

*Primary Examiner*—Timothy M Speer
(74) *Attorney, Agent, or Firm*—Oblon, Spivak, McClelland, Maier & Neustadt, L.L.P.

(57) ABSTRACT

To provide an electroconductive laminate excellent in electrical conductivity and visible light transparency, an electromagnetic wave shielding film for a plasma display, and a protective plate for a plasma display having excellent electromagnetic wave shielding properties, a broad transmission/reflection band and a high visible light transmittance.

An electroconductive laminate 10 comprising a substrate 11, and an electroconductive film 12 having a three-layer structure having a first oxide layer 12a, a metal layer 12b and a second oxide layer 12c laminated sequentially from the substrate 11 side, or having a 3×n layer structure (wherein n is an integer of at least 2) having the above three-layer structure repeated, wherein the first oxide layer 12a contains "zinc oxide" and "titanium oxide or niobium oxide", the metal layer 12b is a layer containing silver, and the second oxide layer 12c contains a mixture of zinc oxide and aluminum oxide, or the like.

10 Claims, 3 Drawing Sheets

FOREIGN PATENT DOCUMENTS

| | | |
|---|---|---|
| JP | 9-174751 A | 7/1997 |
| JP | 2000-117871 A | 4/2000 |
| JP | 2000-229381 A | 8/2000 |
| JP | 2001-146440 A | 5/2001 |
| WO | WO 98/13850 | 4/1998 |

OTHER PUBLICATIONS

U.S. Appl. No. 11/755,577, filed May 30, 2007, Morimoto, et al.
U.S. Appl. No. 11/755,555, filed May 30, 2007, Morimoto, et al.

* cited by examiner

ELECTROCONDUCTIVE LAMINATE, AND ELECTROMAGNETIC WAVE SHIELDING FILM FOR PLASMA DISPLAY AND PROTECTIVE PLATE FOR PLASMA DISPLAY

TECHNICAL FIELD

The present invention relates to an electroconductive laminate, an electromagnetic wave shielding film for a plasma display, and a protective plate for a plasma display.

BACKGROUND ART

Electroconductive laminates having transparency are used as a transparent electrode of e.g. a liquid crystal display device, a windshield for an automobile, a heat mirror, an electromagnetic wave shielding window glass, etc. For example, Patent Document 1 discloses a coated electroconductive laminate comprising a transparent substrate, and a transparent oxide layer comprising zinc oxide and a silver layer alternately laminated on the substrate in a total layer number of (2n+1) (wherein n≧2). Such an electroconductive laminate is described to have sufficient electrical conductivity (electromagnetic wave shielding properties) and visible light transparency. However, if the lamination number n is increased to increase the number of silver layers so as to further improve electrical conductivity (electromagnetic wave shielding properties) of the electroconductive laminate, the visible light transparency tends to decrease.

Further, an electroconductive laminate is used also as an electromagnetic wave shielding film for a plasma display. Since electromagnetic waves are emitted from the front of a plasma display panel (hereinafter referred to as a PDP), for the purpose of shielding the electromagnetic waves, an electromagnetic wave shielding film which is an electroconductive laminate comprising a substrate such as a plastic film and an electroconductive film formed on the substrate is disposed on the observer side of a PDP.

For example, Patent Document 2 discloses a protective plate for a plasma display comprising, as an electroconductive film, a laminate having an oxide layer and a metal layer alternately laminated.

A protective plate for a plasma display is required to have a high transmittance over the entire visible light region and a low reflectance over the entire visible light region, i.e. to have a broad transmission/reflection band, and to have high shielding properties in the near infrared region. In order to broaden the transmission/reflection band, the number of lamination of the oxide layers and the metal layers in the electroconductive film of an electromagnetic wave shielding film to be used for the protective plate should be increased. However, if the number of lamination is increased, such problems arise that (i) the internal stress of the electromagnetic wave shielding film increases, whereby the film curls, or the electroconductive film may be broken to increase the resistance, and (ii) the visible light transparency decreases. Thus, the number of lamination of the oxide layer and the metal layer in the electroconductive film is limited. Accordingly, an electromagnetic wave shielding film having a broad transmission/reflection band and having excellent electrical conductivity (electromagnetic wave shielding properties) and visible light transparency has not been known.

Patent Document 1: JP-B-8-32436
Patent Document 2: WO98/13850

DISCLOSURE OF THE INVENTION

Object to be Accomplished by the Invention

It is an object of the present invention to provide an electroconductive laminate having a broad transmission/reflection band and having excellent electrical conductivity (electromagnetic wave shielding properties), visible light transparency and near infrared shielding properties, an electromagnetic wave shielding film for a plasma display and a protective plate for a plasma display having excellent electromagnetic wave shielding properties, a broad transmission/reflection band, a high visible light transmittance and excellent near infrared shielding properties.

Means to Accomplish the Object

The electroconductive laminate of the present invention is characterized by comprising a substrate, and an electroconductive film having a three-layer structure having a first oxide layer, a metal layer and a second oxide layer laminated sequentially from the substrate side, or having a 3×n layer structure (wherein n is an integer of at least 2) having the above three-layer structure repeated, wherein the first oxide layer is a layer containing, as calculated as oxides, "ZnO" and "$TiO_2$ or $Nb_2O_5$" in a total amount of at least 90 mass % based on the total mass of the first oxide layer; the metal layer is a layer containing silver; and the second oxide layer is one member selected from the group consisting of, as calculated as oxides, a layer containing ZnO and $Al_2O_3$ in a total amount of at least 90 mass % based on the total mass of the second oxide layer, a layer containing ZnO and $Ga_2O_3$ in a total amount of at least 90 mass % based on the total mass of the second oxide layer, a layer containing $In_2O_3$ and $SnO_2$ in a total amount of at least 90 mass % based on the total mass of the second oxide layer, a layer containing $In_2O_3$ and $CeO_2$ in a total amount of at least 90 mass % based on the total mass of the second oxide layer, and a layer containing $SnO_2$ in an amount of at least 90 mass % based on the total mass of the second oxide layer.

The electroconductive layer preferably has a 3×n layer structure (wherein n is an integer of from 2 to 8).

The metal layer is preferably a layer made of pure silver or a silver alloy containing at least one member selected from gold and bismuth.

The electromagnetic wave shielding film for a plasma display of the present invention is characterized by being the electroconductive laminate of the present invention.

The protective plate for a plasma display of the present invention is characterized by comprising a support, the electromagnetic wave shielding film for a plasma display of the present invention formed on the support, and an electrode electrically in contact with the electroconductive film of the electromagnetic wave shielding film for a plasma display.

The protective plate for a plasma display of the present invention may further comprise an electroconductive mesh film.

EFFECTS OF THE INVENTION

The electroconductive laminate of the present invention has a broad transmission/reflection band and has excellent electrical conductivity (electromagnetic wave shielding properties), visible light transparency and near infrared shielding properties.

The electromagnetic wave shielding film for a plasma display of the present invention has excellent electrical conductivity (electromagnetic wave shielding properties) and visible light transparency.

The protective plate for a plasma display of the present invention has excellent electromagnetic wave shielding properties, has a broad transmission/reflection band, has a high visible light transmittance and has excellent near infrared shielding properties.

MEANINGS OF SYMBOLS

1: protective plate (protective plate for a plasma display), 2: protective plate (protective plate for a plasma display), 3: protective plate (protective plate for a plasma display), 10: electroconductive laminate, 11: substrate, 12: electroconductive film, 12a: first oxide layer, 12b: metal layer, 12c: second oxide layer, 13: protective film, 20: support, 30: color ceramic layer, 40: shatterproof film, 50: electrode, 60: protective film, 70: adhesive layer, 80: electroconductive mesh film, 90: electric conductor

BEST MODE FOR CARRYING OUT THE INVENTION

Electroconductive Laminate

Figure 1:
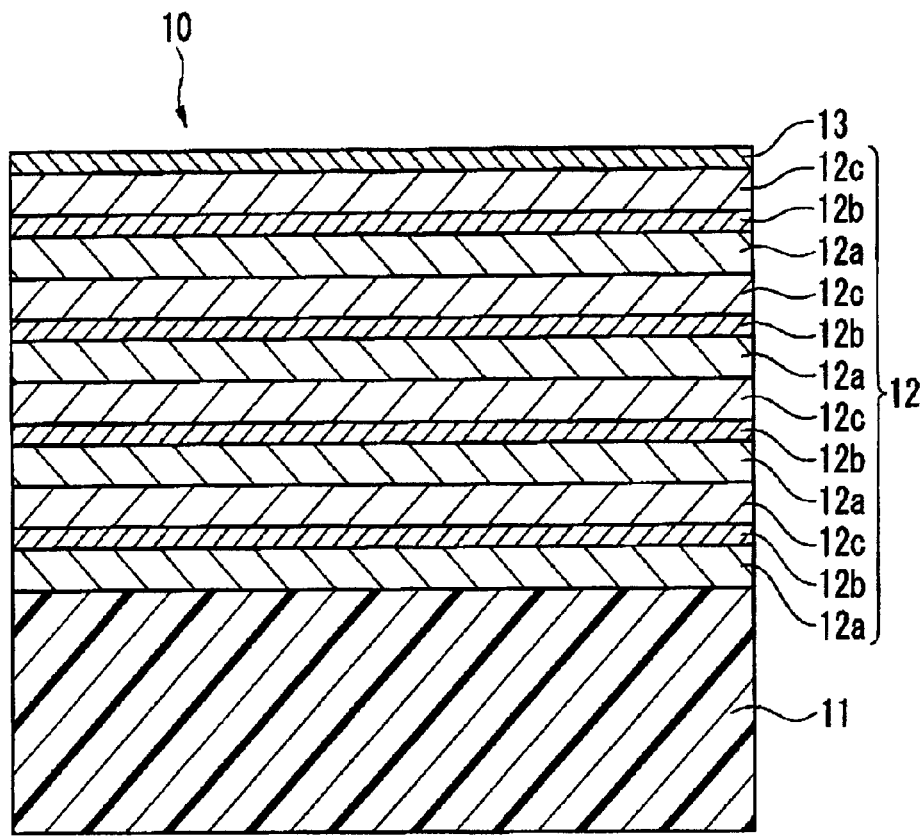
FIG. 1 is a cross-section schematically illustrating one example of the electroconductive laminate of the present invention.

FIG. 1 is a cross-section schematically illustrating one example of the electroconductive laminate of the present invention. The electroconductive laminate 10 schematically comprises a substrate 11, an electroconductive film 12 formed on the substrate 11, and a protective film 13 provided on the electroconductive film 12.

(Substrate)

The Substrate 11 is Preferably a Transparent substrate. The "transparent" in the present invention means being transparent to light at a wavelength in the visible region.

A material of the transparent substrate may, for example, be glass (including tempered glass such as air-cooled tempered glass or chemically tempered glass); or a plastic such as polyethylene terephthalate (PET), triacetyl cellulose (TAC), polycarbonate (PC) or polymethyl methacrylate (PMMA).

(Electroconductive Film)

The electroconductive film in the present invention is a multilayer film having a three-layer structure having a first oxide layer, a metal layer and a second oxide layer laminated sequentially from the substrate side, or having a 3×n layer structure (wherein n is an integer of at least 2) having the above three-layer structure repeated.

The electroconductive film preferably has a 3×n layer structure (wherein n is an integer of at least 2). Further, n is preferably from 2 to 8, more preferably from 2 to 6. When n is at least 2, the protective plate to be obtained will have a sufficiently broad transmission/reflection band, a sufficiently low resistance and improved electrical conductivity. Further, when n is at most 8, the increase in the internal stress of the electroconductive laminate can sufficiently be suppressed. The resistance of the electroconductive film is preferably from 0.4 to 3.5Ω/□, more preferably from 0.4 to 2.5Ω/□, particularly preferably from 0.4 to 1.5Ω/□, so as to secure sufficient electromagnetic wave shielding properties. The resistivity of the electroconductive film 12 is preferably at most 4.5 μΩcm in order that the resistance of the electroconductive film 12 is sufficiently low.

The electroconductive film 12 in FIG. 1 is an example wherein n=4. The electroconductive film 12 is a multilayer film composed of 12 layers in total, prepared in such a manner that a first oxide layer 12a, a metal layer 12b and a second oxide layer 12c are laminated sequentially from the substrate 11 side, and three such three-layer laminates are further formed.

The first oxide layer 12a is a layer containing, as calculated as oxides, ZnO and $TiO_2$ or $Nb_2O_5$ in a total amount of at least 90 mass % based on the total mass of the first oxide layer, whereby the first oxide layer 12a is excellent in the visible light transparency and the electroconductive film 12 has a broad transmission/reflection band. The contents as calculated as oxides in the present invention can be determined by measurement by Rutherford back scattering spectrometry.

It is considered that in the first oxide layer 12a, zinc (Zn) and titanium (Ti) or niobium (Nb) are present as zinc oxide (ZnO), titanium oxide ($TiO_2$) or niobium oxide ($Nb_2O_5$) or as a mixture of composite oxides thereof.

The amount of titanium (Ti) or niobium (Nb) in the first oxide layer 12a is preferably from 1 to 50 at %, more preferably from 5 to 20 at % based on the total amount (100 at %) of titanium (Ti) or niobium (Nb) and zinc (Zn). When the amount of titanium (Ti) or niobium (Nb) is within this range, a protective plate to be obtained will have a broad transmission/reflection band. Further, the grains in the first oxide layer 12a can be made small, whereby in formation of a metal layer 12b, a homogeneous and dense film will be formed, thereby to obtain a metal layer 12b excellent in electrical conductivity.

In the first oxide layer 12a, as calculated as oxides, the total amount of ZnO and $TiO_2$ or $Nb_2O_5$ is preferably at least 95 mass %, more preferably at least 99 mass % based on the total mass of the first oxide layer, whereby a broad transmission/reflection band will be maintained.

In the first oxide layer 12a, metal other than zinc, titanium and niobium may optionally be incorporated as oxide as the case requires, within a range not to impair the physical properties. For example, gallium, indium, aluminum, magnesium, tin or the like may be incorporated.

The geometrical film thickness (hereinafter referred to simply as the thickness) of the first oxide layer 12a is preferably from 30 to 50 nm, particularly preferably from 35 to 45 nm. The "thickness" in the present invention is a value calculated from the sputtering time at the time of deposition using an analytical curve preliminarily prepared as follows.

Preparation of Analytical Curve: on the Surface of a substrate to a part of which an adhesive tape is bonded, sputtering is conducted for an optional time period to conduct film deposition. After the film deposition, the above adhesive tape is peeled off from the substrate. The difference in height between a portion to which the adhesive tape has been bonded and no film is formed and a portion on which a film is formed on the surface of the substrate to which a film is formed, is measured by a feeler type surface roughness measuring apparatus. The difference in height corresponds to the thickness at the sputtering time. Then, the thickness is measured in the same manner as above except that the time period for sputtering at the time of film deposition is changed. Such measurement is repeatedly carried out at least three times as the case requires. An analytical curve of the sputtering time and the thickness is prepared from values obtained by the above measurement.

The metal layer 12b is a layer containing silver, and silver is contained preferably in an amount of at least 95 mass % in the metal layer 12b (100 mass %), whereby the resistance of the electroconductive film 12 can be made low.

The metal layer 12b is preferably a layer made of pure silver with a view to lowering the resistance of the electroconductive film 12. In the present invention, the "pure silver" means that the metal layer 12b (100 mass %) contains silver in an amount of 99.9 mass % or more.

The metal layer 12b is preferably a layer made of a silver alloy containing at least one member selected from gold and bismuth with a view to suppressing migration of silver and thus increasing moisture resistance. The total amount of gold and bismuth is preferably from 0.2 to 1.5 mass % in the metal layer 12b (100 mass %) so that the resistivity will be at most 4.5 μΩcm.

The total thickness of all the metal layers 12b is, for example, in a case where the aimed resistance of the electroconductive laminate 10 to be obtained is 1.5Ω/□, preferably from 25 to 60 nm, more preferably from 25 to 50 nm. In a case where the aimed resistance is 1Ω/□, it is preferably from 35 to 80 nm, more preferably from 35 to 70 nm. With respect to the thickness of each metal layer 12b, the total thickness is properly allocated among the respective metal layers 12b. Since the specific resistivities of the respective metal layers 12b increase as the number of the metal layers 12b increases, the total thickness tends to increase so as to lower the resistance.

The second oxide layer 12c is at least one member selected from the group consisting of, as calculated as oxides, a layer containing ZnO and $Al_2O_3$ in a total amount of at least 90 mass % based on the total mass of the second oxide layer (hereinafter referred to as an AZO layer), a layer containing ZnO and $Ga_2O_3$ in a total amount of at least 90 mass % based on the total mass of the second oxide layer (hereinafter referred to as a GZO layer), a layer containing $In_2O_3$ and $SnO_2$ in a total amount of at least 90 mass % based on the total mass of the second oxide layer (hereinafter referred to as an ITO layer), a layer containing $In_2O_3$ and $CeO_2$ in a total amount of at least 90 mass % based on the total mass of the second oxide layer (hereinafter referred to as an ICO layer), and a layer containing $SnO_2$ in an amount of at least 90 mass % based on the total mass of the second oxide layer (hereinafter referred to as a $SnO_2$ layer).

"As calculated as oxides" means a value of the content of each metal determined as calculated as an oxide of a single metal. The same applies to the other components in the second oxide layer, and the amount as calculated as an oxide of a single substance of each of the other components is regarded as the content of said other component.

A target containing ZnO and $Al_2O_3$ in a total amount of at least 90 mass % (hereinafter referred to as an AZO target), a target containing ZnO and $Ga_2O_3$ in a total amount of at least 90 mass % (hereinafter referred to as a GZO target), a target containing $In_2O_3$ and $SnO_2$ in a total amount of at least 90 mass % (hereinafter referred to as an ITO target), a target containing $In_2O_3$ and $CeO_2$ in a total amount of at least 90 mass % (hereinafter referred to as an ICO target), and a target containing $SnO_2$ in an amount of at least 90 mass % (hereinafter referred to as a $SnO_2$ target), as calculated as oxides, provide higher deposition rate in the after-mentioned sputtering or the like as compared with a target containing ZnO and $TiO_2$ in a total amount of at least 90 mass % (hereinafter referred to as a TZO target) and a target containing ZnO and $Nb_2O_5$ in a total amount of at least 90 mass % (hereinafter referred to as a NZO target), as calculated as oxides, to be used for deposition of the first oxide layer 12a. Accordingly, by providing the second oxide layer 12c between the metal layer 12b and the first oxide layer 12a and as the outermost layer of the electroconductive film 12, the first oxide layer 12a, deposition of which will take long, can be made thin without decreasing the optical properties, and further, it is not necessary to provide the first oxide layer 12a as the outermost layer. Thus, production efficiency of the electroconductive laminate 10 will improve.

The second oxide layer 12c is particularly preferably an AZO layer, in view of excellent deposition rate.

The amount of aluminum in the AZO layer is preferably from 1 to 10 at %, more preferably from 2 to 7 at % based on the total amount (100 at %) of aluminum and zinc, whereby a film excellent in visible light transmittance will be obtained.

In the AZO layer, zinc and aluminum are contained in a state of oxides. The oxides are considered to be present in the form of a mixture of zinc oxide and aluminum oxide, and a composite oxide thereof. The zinc oxide, the aluminum oxide and the composite oxide are contained in optional ratios in the second oxide layer.

The amount of gallium in the GZO layer is preferably from 0.5 to 10 at %, more preferably from 2 to 7 at % based on the total amount (100 at %) of gallium and zinc, whereby a film excellent in visible light transmittance and electrical conductivity will be obtained.

In the GZO layer, zinc and gallium are contained in a state of oxides. The oxides are considered to be present in the form of a mixture of zinc oxide and gallium oxide and a composite oxide thereof. The zinc oxide, the gallium oxide and the composite oxide are contained in optional ratios in the second oxide layer.

The amount of tin in the ITO layer is preferably from 1 to 50 at %, more preferably from 5 to 40 at % based on the total amount (100 at %) of tin and indium, whereby a film excellent in corrosion resistance and electrical conductivity will be obtained.

In the ITO layer, indium and tin are contained in a state of oxides. The oxides are considered to be present in the form of a mixture of indium oxide and tin oxide and a composite oxide thereof. The indium oxide, the tin oxide and the composite oxide are contained in optional ratios in the second oxide layer.

The amount of cerium in the ICO layer is preferably from 1 to 40 at %, more preferably from 10 to 30 at % based on the total amount (100 at %) of cerium and indium, whereby a film excellent in corrosion resistance, gas barrier properties and visible light transmittance will be obtained.

In the ICO layer, indium and cerium are contained in a state of oxides. The oxides are considered to be present in the form of a mixture of indium oxide and cerium oxide and a composite oxide thereof. The indium oxide, the cerium oxide and the composite oxide are contained in optional ratios in the second oxide layer.

The $SnO_2$ layer is available at a low cost, and provides a film excellent in optical properties.

In the second oxide layer, as calculated as oxides, the total content of ZnO and $Al_2O_3$, the total content of ZnO and $Ga_2O_3$, the total content of $In_2O_3$ and $SnO_2$, the total content of $In_2O_3$ and $CeO_2$ or the $SnO_2$ content is preferably at least 95 mass %, more preferably at least 99 mass % based on the total mass of the second oxide layer.

The thickness of the second oxide layer 12c is preferably from 20 to 60 nm, particularly preferably from 30 to 50 nm.

The thickness ratio of the first oxide layer 12a to the adjacent second oxide layer 12c (first oxide layer 12a:second oxide layer 12c) is preferably from 5:5 to 9:1.

A method of forming the electroconductive film 12 (first oxide layer 12a, metal layer 12b and second oxide layer 12c) on the substrate 11 may, for example, be sputtering, vacuum vapor deposition, ion plating or chemical vapor deposition. Among them, sputtering is preferred in view of the stability of quality and properties. The sputtering may, for example, be pulse sputtering or AC sputtering.

Formation of the electroconductive film 12 by sputtering may be carried out, for example, by the following (i) to (iii).

(i) Sputtering is carried out using a target consisting of TZO or NZO while introducing an argon gas with which an oxygen gas is mixed to form a first oxide layer 12a on a substrate 11.

(ii) Sputtering is carried out using a silver target or a silver alloy target while introducing an argon gas to form a metal layer 12b on the first oxide layer 12a.

(iii) Sputtering is carried out using one target selected from the group consisting of AZO, GZO, ITO, ICO and $SnO_2$ while introducing an argon gas with which an oxygen gas is mixed to form a second oxide layer 12c on the metal layer 12b.

By the operation (i) to (iii), an electroconductive film 12 having a three-layer structure is formed. Or, the operation (i) to (iii) is repeatedly carried out to form an electroconductive film 12 having a 3×n layer structure.

The target to be used for formation of the first oxide layer 12a or the second oxide layer 12c, such as TZO, NZO, AZO, GZO, ITO, ICO or $SnO_2$ can be prepared by mixing high purity (usually 99.9%) powders of the respective metal oxides, followed by sintering by hot pressing, HIP (hot isostatic pressing) or normal pressure firing.

(Protective Film)

The protective film 13 is a layer which protects the electroconductive film 12 from moisture and protects the second oxide layer 12c from an adhesive (particularly an alkaline adhesive) when an optional resin film (e.g. a functional film such as moisture proof film, shatterproof film, antireflection film, protective film for e.g. near infrared shielding, or near infrared-absorbing film) is bonded to the electroconductive laminate 10. The protective film 13 is an optional constituent in the present invention and may be omitted.

Specifically, the protective film 13 may, for example, be a film of an oxide or nitride of a metal such as tin, indium, titanium or silicon, or a film made of a mixture of a plurality of oxides. Among them, an ITO film is particularly preferred. The ITO film is preferably one having the same composition as the above-described second oxide layer 12c.

The thickness of the protective film 13 is preferably from 2 to 30 nm, more preferably from 3 to 20 nm.

The electroconductive laminate of the present invention is excellent in visible light transparency. The electroconductive laminate of the present invention preferably has a luminous transmittance of at least 55%, more preferably at least 60%. Further, the electroconductive laminate of the present invention has a transmittance at a wavelength of 850 nm of preferably at most 5%, particularly preferably at most 2%.

(Application)

The electroconductive laminate of the present invention is excellent in electrical conductivity (electromagnetic wave shielding properties), visible light transparency and near infrared shielding properties, and when laminated on a support of e.g. glass, has a broad transmission/reflection band and is thereby useful as an electromagnetic wave shielding film for a plasma display.

Further, the electroconductive laminate of the present invention can be used as a transparent electrode of e.g. a liquid crystal display device. Such a transparent electrode has a low surface resistance and is thereby well responsive, and has a reflectance as low as that of glass and thereby provides good visibility.

Further, the electroconductive laminate of the present invention can be used as a windshield for an automobile. Such a windshield for an automobile exhibits function to prevent fogging or to melt ice by applying a current to the electroconductive film, the voltage required to apply the current is low since it has a low resistance, and it has a reflectance so low as that of glass, whereby visibility of a driver will not be impaired.

The electroconductive laminate of the present invention, which has a very high reflectance in the infrared region, can be used as a heat mirror to be provided on e.g. a window of a building.

Further, the electroconductive laminate of the present invention, which has a high electromagnetic wave shielding effect, can be used for an electromagnetic wave shielding window glass which prevents electromagnetic waves emitted from electrical and electronic equipment from leaking out of the room and prevents electromagnetic waves affecting electrical and electronic equipment from invading the interior from the outside.

Protective Plate for Plasma Display

Now, an example wherein the electroconductive laminate of the present invention is used as an electromagnetic wave shielding film of a protective plate for a plasma display (hereinafter referred to as a protective plate) will be described.

First Embodiment

Figure 2:
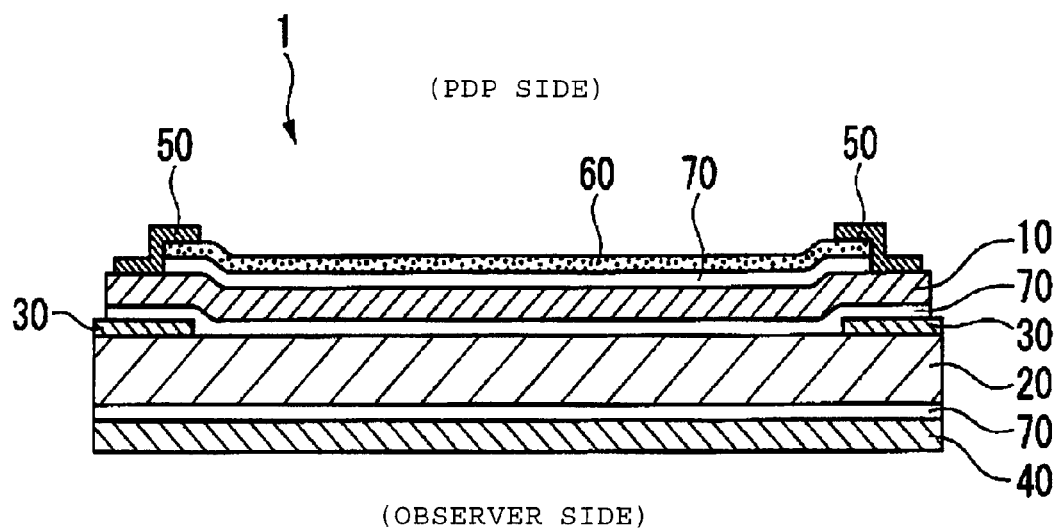
FIG. 2 is a cross-section schematically illustrating a first embodiment of the protective plate for a plasma display of the present invention.

FIG. 2 illustrates a protective plate according to a first embodiment. The protective plate 1 comprises a support 20, a color ceramic layer 30 provided at a peripheral portion of the support 20, an electroconductive laminate 10 bonded on the surface of the support 20 via an adhesive layer 70 so that a peripheral portion of the electroconductive laminate 10 is overlaid on the color ceramic layer 30, a shatterproof film 40 bonded via an adhesive layer 70 on the opposite side of the support 20 from the electroconductive layer 10, a protective film 60 bonded to the surface of the electroconductive laminate 10 via an adhesive layer 70, and an electrode 50 electrically in contact with the electroconductive film 12 of the electroconductive layer 10 provided at a peripheral portion of the electroconductive laminate 10 and the protective film 60. The protective plate 1 is an example wherein the electroconductive laminate 10 is provided on the PDP side of the support 20.

The support 20 is a transparent substrate having higher rigidity than that of the substrate 11 of the electroconductive laminate 10. By providing the support 20, no warpage will occur by the temperature difference caused between the surface on the PDP side and the observer side, even if the material of the substrate 11 of the electroconductive laminate 10 is a plastic such as a PET.

As a material of the support 20, the same material as the above-described material of the substrate 11 may be mentioned.

The color ceramic layer 30 is a layer to mask the electrode 50 so that it will not directly be seen from the observer side. The color ceramic layer 30 can be formed, for example, by printing on the support 20 or by bonding a color tape.

The shatterproof film 40 is a film to prevent flying of fragments of the support 20 when the support 20 is damaged. As the shatterproof film 40, a known film may be used.

The shatterproof film 40 may have an antireflection function. A film having both shatterproof function and antireflection function may, for example, be ARCTOP (tradename) manufactured by Asahi Glass Company, Limited. ARCTOP is a polyurethane type flexible resin film having self-healing properties and shatterproof properties, having a low refractive index antireflection film made of an amorphous fluoropolymer formed on one side of the film to apply antireflection treatment. Further, a film comprising a polymer film such as PET and a low refractive index antireflection layer formed thereon wetly or dryly may also be mentioned.

The electrode 50 is provided to be electrically in contact with the electroconductive film 12 so that the electromagnetic wave shielding effect of the electroconductive film 12 of the electroconductive laminate 10 is exhibited. The electrode 50 is preferably provided on the entire peripheral portion of the electroconductive laminate 10 with a view to securing the electromagnetic wave shielding effect of the electroconductive film 12.

As a material of the electrode 50, one having a lower resistance is superior in view of the electromagnetic wave shielding properties. For example, the electrode 50 is prepared by applying a silver paste containing silver and glass frit or a copper paste containing cupper and glass frit, followed by firing.

The protective film 60 is a film to protect the electroconductive laminate 10 (electroconductive film 12). To protect the electroconductive film 12 from moisture, a moisture-proof film is provided. The moisture-proof film may, for example, be a plastic film of e.g. PET or polyvinylidene chloride. Further, as the protective film 60, the above-described shatterproof film may be used.

An adhesive of the adhesive layer 70 may be a commercially available adhesive. For example, it may be an adhesive such as an acrylic ester copolymer, a polyvinyl chloride, an epoxy resin, a polyurethane, a vinyl acetate copolymer, a styrene/acrylic copolymer, a polyester, a polyamide, a polyolefin, a styrene/butadiene copolymer type rubber, a butyl rubber or a silicone resin. Among them, an acrylic adhesive is particularly preferred, with which favorable moisture proof properties are achieved. In the adhesive layer 70, additives such as an ultraviolet absorber may be incorporated.

Second Embodiment

Figure 3:
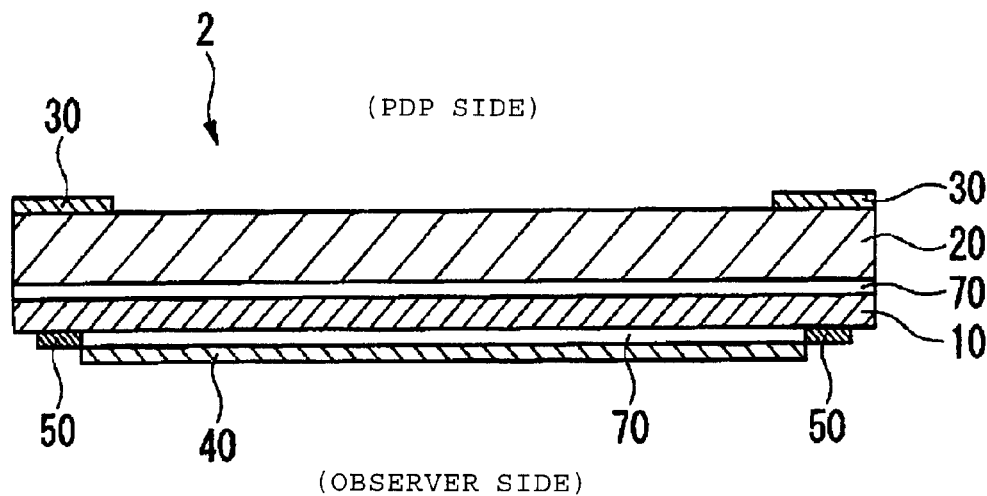
FIG. 3 is a cross-section schematically illustrating a second embodiment of the protective plate for a plasma display of the present invention.

FIG. 3 illustrates a protective plate according to a second embodiment. The protective plate 2 comprises a support 20, an electroconductive laminate 10 bonded on the surface of the support 20 via an adhesive layer 70, an electrode 50 electrically in contact with the electroconductive film 12 of the electroconductive laminate 10 provided at a peripheral portion of the electroconductive laminate 10, a shatterproof film 40 bonded on the surface of the electroconductive laminate 10 via an adhesive layer 70 so as not to be overlaid on the electrode 50, and a color ceramic layer 30 provided at a peripheral portion of the support 20 opposite from the electroconductive laminate 10. The protective plate 20 is an example wherein the electroconductive laminate 10 is provided on the observer side of the support 20.

In the second embodiment, the same constituents as in the first embodiment are expressed by the same symbols as in FIG. 2 and their description is omitted.

Third Embodiment

Figure 4:
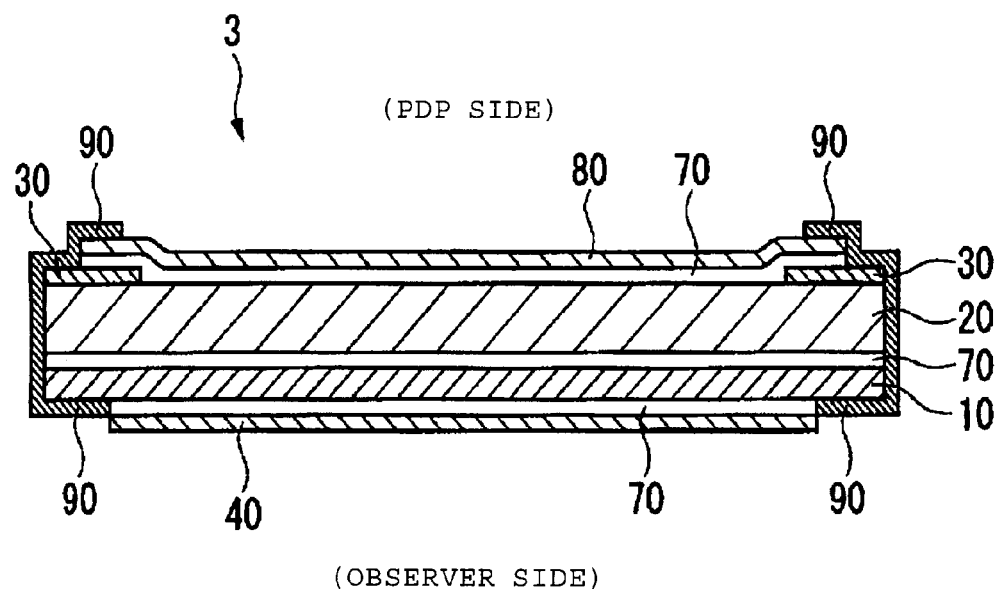
FIG. 4 is a cross-section schematically illustrating a third embodiment of the protective plate for a plasma display of the present invention.

FIG. 4 illustrates a protective plate according to a third embodiment. The protective plate 3 comprises a support 20, an electroconductive laminate 10 bonded on the surface of the support 20 via an adhesive layer 70, a shatterproof film 40 bonded on the surface of the electroconductive laminate 10 via an adhesive layer 70, a color ceramic layer 30 provided at a peripheral portion on the surface of the support 20 opposite from the electroconductive laminate 10, an electroconductive mesh film 80 bonded on the surface of the support 20 via an adhesive layer 70 so that a peripheral portion of the electroconductive mesh film 80 is overlaid on the color ceramic layer 30, and an electric conductor 90 provided at a peripheral portion of the protective plate 3 so as to electrically connect the electroconductive film 12 of the electroconductive laminate 10 to an electroconductive mesh layer (not shown) of the electroconductive mesh film 80. The protective plate 3 is an example wherein the electroconductive laminate 10 is provided on the observed side of the support 20 and the electroconductive mesh film 80 is provided on the PDP side of the support 20.

In the third embodiment, the same constituents as in the first embodiment are expressed by the same symbols as in FIG. 2 and their description is omitted.

The electroconductive mesh film 80 is one comprising a transparent film and an electroconductive mesh layer made of copper formed on the transparent film. Usually, it is produced by bonding a copper foil to a transparent film, and processing the laminate into a mesh.

The copper foil may be either rolled copper or electrolytic copper, and known one is used property according to need. The copper foil may be subjected to surface treatment. The surface treatment may, for example, be chromate treatment, surface roughening, acid wash or zinc chromate treatment. The thickness of the copper foil is preferably from 3 to 30 μm, more preferably from 5 to 20 μm, particularly preferably from 7 to 10 μm. When the thickness of the copper foil is at most 30 μm, the etching time can be shortened, and when it is at least 3 μm, high electromagnetic wave shielding properties will be achieved.

The open area of the electroconductive mesh layer is preferably from 60 to 95%, more preferably from 65 to 90%, particularly preferably from 70 to 85%.

The shape of the openings of the electroconductive mesh layer is an equilateral triangle, a square, an equilateral hexagon, a circle, a rectangle, a rhomboid or the like. The open areas are preferably uniform in shape and aligned in a plane.

With respect to the size of the openings, one side or the diameter is preferably from 5 to 200 μm, more preferably from 10 to 150 μm. When one side or the diameter of the openings is at most 200 μm, electromagnetic wave shielding properties will improve, and when it is at least 5 μm, influences over an image of a PDP will be small.

The width of a metal portion other than the openings is preferably from 5 to 50 μm. That is, the mesh pitch of the openings is preferably from 10 to 250 μm. When the width of the metal portion is at least 5 μm, processing will be easy, and when it is at most 50 μm, influences over an image of a PDP will be small.

If the sheet resistance of the electroconductive mesh layer is lower than necessary, the film tends to be thick, and such will adversely affect optical performance, etc. of the protective plate 3, such that no sufficient openings can be secured. On the other hand, if the sheet resistance of the electroconductive mesh layer is higher than necessary, no sufficient electromagnetic wave shielding properties will be obtained. Accordingly, the sheet resistance of the electroconductive mesh layer is preferably from 0.01 to 10Ω/□, more preferably from 0.01 to 2Ω/□, particularly preferably from 0.05 to 1Ω/□.

The sheet resistance of the electroconductive mesh layer can be measured by a four-probe method using electrodes at least five times larger than one side or the diameter of the opening with a distance between electrodes at least five times the mesh pitch of the openings. For example, when 100 μm square openings are regularly arranged with metal portions with a width of 20 μm, the sheet resistance can be measured by arranging electrodes with a diameter of 1 mm with a distance of 1 mm. Otherwise, the electroconductive mesh film is processed into a stripe, electrodes are provided on both ends in the longitudinal direction to measure the resistance R therebetween thereby to determine the sheet resistance from the length a in the longitudinal direction and the length b in the lateral direction in accordance with the following formula:

Sheet resistance=$R \times b/a$

To laminate a copper foil on a transparent film, a transparent adhesive is used. The adhesive may, for example, be an acrylic adhesive, an epoxy adhesive, a urethane adhesive, a silicone adhesive or a polyester adhesive. As a type of the adhesive, a two-liquid type or a thermosetting type is preferred. Further, the adhesive is preferably one having excellent chemical resistance.

As a method of processing a copper foil into a mesh, a photoresist process may be mentioned. In the print process, the pattern of the openings is formed by screen printing, gravure printing or the like. By the photoresist process, a photoresist material is formed on a copper foil by roll coating, spin coating, overall printing or transferring, followed by exposure, development and etching to form the pattern of the openings. As another method of forming the electroconductive mesh layer, a method of forming the pattern of the openings by the print process such as screen printing or gravure printing may be mentioned.

The electric conductor 90 is to electrically connect the electroconductive film 12 of the electroconductive laminate 10 to the electroconductive mesh layer of the electroconductive mesh film 80. The electric conductor 90 may, for example, be an electroconductive tape. By electrically connecting the electroconductive film 12 of the electroconductive laminate 10 to the electroconductive mesh layer of the electroconductive mesh film 80, the whole sheet resistance can be further decreased, whereby the electromagnetic wave shielding effect will further improve.

As each of the protective plates 1 to 3 is disposed in front of a PDP, it preferably has a visible light transmittance of at least 35% so as not to prevent an image of the PDP from being seen. Further, the visible light reflectance is preferably less than 6%, particularly preferably less than 3%. Further, the transmittance at a wavelength of 850 nm is preferably at most 5%, particularly preferably at most 2%.

Another Embodiment

Further, the protective plate of the present invention is not limited to the above-described first to third embodiments. For example, bonding by heat may be carried out without providing the adhesive layer 70.

Further, on the protective plate of the present invention, an antireflection film or an antireflection layer which is a low refractive index thin film may be provided as the case requires. The low refractive index is a refractive index of from 1.1 to 1.6, preferably from 1.2 to 1.5, more preferably from 1.3 to 1.48.

The antireflection film may be known one, and a fluororesin type film is particularly preferred in view of antireflection properties.

With respect to the antireflection layer, in order that the reflectance of the protective plate is low and the preferred reflected color will be obtained, preferred is one of which the wavelength at which the reflectance in the visible range is minimum, is from 500 to 600 nm, particularly preferably from 530 to 590 nm.

Further, the protective plate may be made to have near infrared shielding function. As a method to make the protective plate have near infrared shielding function, a method of using a near infrared shielding film, a method of using a near infrared absorbing substrate, a method of using an adhesive having a near infrared absorber incorporated therein at the time of laminating films, a method of adding a near infrared absorber to an antireflection film or the like to make the film or the like have near infrared absorbing function, a method of using an electroconductive film having near infrared reflection function may, for example, be mentioned.

In the above electroconductive laminate 10, the first oxide layer 12a containing TZO or NZO having a high refractive index is in contact with the substrate 11 side of the metal layer 12b, whereby each of the protective plates 1 to 3 using the laminate has a broad transmission/reflection band without increasing the number of lamination of the electroconductive film 12. Further, the metal layer 12b is provided on the surface of the first oxide layer 12a containing TZO or NZO, whereby the metal layer 12b has a low resistance. As a result, excellent electrical conductivity (electromagnetic wave shielding properties) can be achieved even if the number of lamination of the electroconductive film 12 (the number of the metal layers 12b) is reduced. Further, the transmission/reflection band can be broadened, and excellent electrical conductivity can be achieved without increasing the number of lamination of the electroconductive film 12. Thus, the number of lamination of the electroconductive film 12 can be reduced and as a result, excellent visible light transparency will be obtained.

Further, each of the above protective plates 1 to 3, which uses the electroconductive laminate 10 having a broad transmission/reflection band and having excellent electrical conductivity, visible light transparency and near infrared shielding properties, has excellent electromagnetic wave shielding properties, a broad transmission/reflection band, a high visible light transmittance and excellent near infrared shielding properties.

EXAMPLES

Example 1

An electroconductive laminate 10 shown in FIG. 1 was prepared as follows.

First, dry cleaning by ion beams was carried out to clean the surface of a PET film with a thickness of 100 μm as a substrate 11. For the dry cleaning by ion beams, about 30% of oxygen was mixed with an argon gas, an electric power of 100 W was charged, and argon ions and oxygen ions ionized by an ion beam source were applied to the surface of the substrate 11.

(i) AC sputtering was carried out using a TZO target (ZnO:TiO$_2$=85:15 (mass ratio)) under a pressure of 0.15 Pa at an electric power density of 5 W/cm$^2$ while introducing an argon gas with which 5 vol % of an oxygen gas was mixed, to form a first oxide layer 12a(1) with a thickness of 35 nm on the surface of the substrate 11. As measured by ESCA5500 manufactured by ULVAC-PHI, Inc., in the first oxide layer 12a(1), the amount of zinc was 85 at % and the amount of titanium was 15 at % based on the total amount (100 at %) of zinc and titanium.

(ii) Pulse sputtering was carried out using a silver alloy target doped with 1 mass % of gold under a pressure of 0.25 Pa at a frequency of 100 kHz at an electric power density of 0.4 W/cm$^2$ at a reverse pulse duration of 5 μs while introducing an argon gas to form a metal layer 12b(1) with a thickness of 10 nm on the surface of the first oxide layer 12a(1).

(iii) Pulse sputtering was carried out using an AZO target (ZnO target doped with 5 mass % of Al$_2$O$_3$) under a pressure of 0.11 Pa at a frequency of 100 kHz at an electric power density of 3 W/cm$^2$ at a reverse pulse duration of 1 μs while introducing an argon gas with which 4 vol % of an oxygen gas was mixed to form a second oxide layer 12c(1) with a thickness of 35 nm on the surface of the metal layer 12b(1). As measured by ESCA5500 manufactured by ULVAC-PHI, Inc., in the second oxide layer 12c(1), the amount of zinc was 95.3 at % and the amount of aluminum was 4.7 at % based on the total amount (100 at %) of zinc and aluminum.

A first oxide layer 12a(2) with a thickness of 35 nm was formed on the surface of the second oxide layer 12c(1) in the same manner as in the above (i).

A metal layer 12b(2) with a thickness of 14 nm was formed on the surface of the first oxide layer 12(2) in the same manner as in the above (ii) except that the electric power density was changed to 0.54 W/cm$^2$.

A second oxide layer 12c(2) with a thickness of 35 nm was formed on the surface of the metal layer 12b(2) in the same manner as in the above (iii).

A first oxide layer 12a(3) with a thickness of 35 nm was formed on the surface of the second oxide layer 12c(2) in the same manner as in the above (i).

A metal layer 12b(3) with a thickness of 14 nm was formed on the surface of the first oxide layer 12a(3) in the same manner as in the above (ii) except that the electric power density was changed to 0.54 W/cm$^2$.

A second oxide layer 12c(3) with a thickness of 35 nm was formed on the surface of the metal layer 12b(3) in the same manner as in the above (iii).

A first oxide layer 12a(4) with a thickness of 35 nm was formed on the surface of the second oxide layer 12c(3) in the same manner as in the above (i).

A metal layer 12b(4) with a thickness of 10 nm was formed on the surface of the first oxide layer 12a(4) in the same manner as in the above (ii).

A second oxide layer 12c(4) with a thickness of 30 nm was formed on the surface of the metal layer 12b(4) in the same manner as in the above (iii).

Pulse sputtering was carried out using an ITO target (indium:tin=90:10 (mass ratio)) under a pressure of 0.15 Pa at a frequency of 100 kHz at an electric power density of 0.64 W/cm$^2$ at a reverse pulse duration of 1 μs while introducing argon with which 5 vol % of an oxygen gas was mixed to form an ITO film with a thickness of 5 nm as a protective film 13 on the surface of the second oxide 12c(4).

In such a manner, an electroconductive laminate 10 comprising four first oxide layers 12a, four metal layers 12b and four second oxide layers 12c as shown in FIG. 1 was obtained. Further, an adhesive layer 70 (acrylic adhesive, thickness 25 μm) was provided on the surface on the substrate 11 side of the electroconductive laminate 10.

A protective plate 1 shown in FIG. 2 was prepared as follows.

A glass plate as a support 20 was cut into a predetermined size, chamfered and cleaned, and an ink for a color ceramic layer was applied at the periphery of the glass plate by screen printing and sufficiently dried to form a color ceramic layer 30. Then, the support 20 on which the color ceramic layer 30 was formed was heated to 660° C. and then air cooled to apply glass tempering treatment.

The electroconductive laminate 10 was bonded on the color ceramic layer 30 side of the support 20 via the above adhesive layer 70. Then, for the purpose of protecting the electroconductive laminate 10, a protective film 60 (ARCTOP CP21, tradename, manufactured by Asahi Glass Company, Limited, thickness 100 μm) was bonded on the surface of the electroconductive laminate 10 via an adhesive layer 70 (acrylic adhesive, thickness 25 μm). Here, for the purpose of forming electrodes, a portion (electrode formation portion) on which no protective film 60 was bonded was left at the peripheral portion of the electroconductive laminate 10.

Then, on the electrode formation portion, a silver paste (AF4810, tradename, manufactured by TAIYO INK MFG. CO., LTD.) was applied by screen printing with a nylon mesh #180 with an emulsion thickness of 20 μm, followed by drying in a circulating hot air oven at 85° C. for 35 minutes to form an electrode 50.

Then, on the back side of the support 20 (a side opposite to the side where the electroconductive laminate 10 was bonded), a polyurethane flexible resin film (ARCTOP URP2199, tradename, manufactured by Asahi Glass Company, Limited, thickness 300 μm) as a shatterproof film 40 was bonded via an adhesive layer 70 (acrylic adhesive, thickness 25 μm). This polyurethane flexible resin film also has an antireflection function. Usually, a coloring agent is added to the polyurethane flexible resin film for color tone correction and Ne cut to improve color reproducibility, but in this Example, the resin film was not colored since no evaluation of the color tone correction and the Ne cut was carried out.

Figure 5:
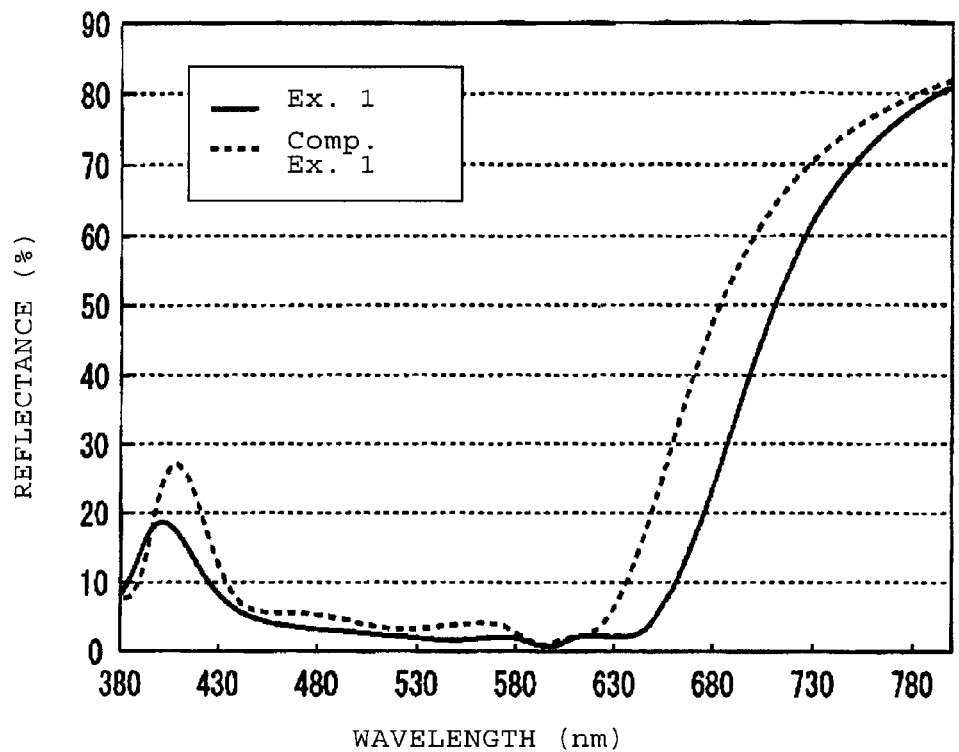
FIG. 5 is a graph illustrating reflection spectra of protective plates in Example 1 and Comparative Example 1.
Figure 6:
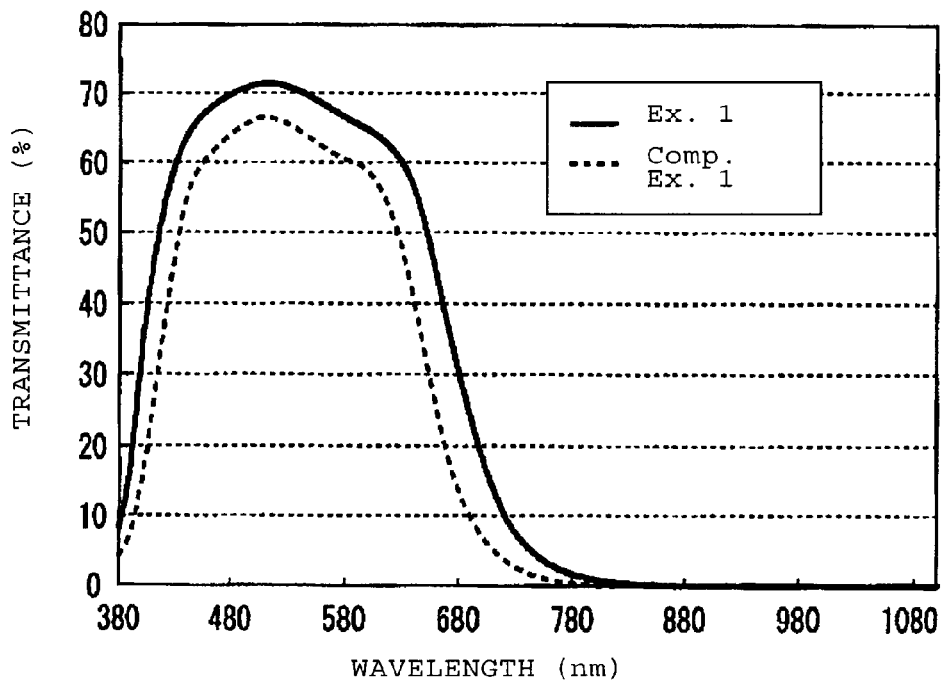
FIG. 6 is a graph illustrating transmission spectra of protective plates in Example 1 and Comparative Example 1.

Of the protective plate 1 thus prepared, the luminous transmittance (stimulus Y stipulated in JIS Z 8701) was 68.3%, and the luminous reflectance was 2.20%, as measured by color analyzer TC1800 manufactured by Tokyo Denshoku co., Ltd. from the observer side in FIG. 2. Further, the transmittance at a wavelength of 850 nm was 0.8%. The reflection spectrum and the transmission spectrum of the protective plate 1 are shown in FIGS. 5 and 6, respectively.

Further, the sheet resistance (surface resistance) measured by eddy current type resistance measuring apparatus SRM12 manufactured by Nagy was 0.99Ω/□.

Comparative Example 1

First, a substrate subjected to dry cleaning in the same manner as in Example 1 was prepared.

(i) Pulse sputtering was carried out using an AZO target (ZnO target doped with 5 mass % of Al$_2$O$_3$) under a pressure of 0.35 Pa at a frequency of 100 kHz at an electric power density of 5.7 W/cm$^2$ at a reverse pulse duration of 1 μs while introducing an argon gas with which 3 vol % of an oxygen gas was mixed to form an oxide layer (1) with a thickness of 40 nm on the surface of the substrate. As measured by ESCA5500 manufactured by ULVAC-PHI, Inc., in the oxide layer (1), the amount of zinc was 95.3 at % and the amount of aluminum was 4.7 at % based on the total amount (100 at %) of zinc and aluminum.

(ii) Pulse sputtering was carried out using a silver alloy target doped with 1 mass % of gold under a pressure of 0.5 Pa at a frequency of 100 kHz at an electric power density of 0.6 W/cm$^2$ at a reverse pulse duration of 5 μs while introducing an argon gas to form a metal layer (1) with a thickness of 13 nm on the surface of the oxide layer (1).

An oxide layer (2) with a thickness of 80 nm was formed on the surface of the metal layer (1) in the same manner as in the above (i) except that the electric power density was changed to 4.7 W/cm$^2$.

A metal layer (2) with a thickness of 16 nm was formed on the surface of the oxide layer (2) in the same manner as in the above (ii) except that the electric power density was changed to 0.9 W/cm$^2$.

An oxide layer (3) with a thickness of 80 nm was formed on the surface of the metal layer (2) in the same manner as in the above (i) except that the electric power density was changed to 4.7 W/cm$^2$.

A metal layer (3) with a thickness of 16 nm was formed on the surface of the oxide layer (3) in the same manner as in the above (ii) except that the electric power density was changed to 1 W/cm$^2$.

An oxide layer (4) with a thickness of 80 nm was formed on the surface of the metal layer (3) in the same manner as in the above (i) except that the electric power density was changed to 4.7 W/cm$^2$.

A metal layer (4) with a thickness of 13 nm was formed on the surface of the oxide layer (4) in the same manner as in the above (ii) except that the electric power density was changed to 1 W/cm$^2$.

An oxide layer (5) with a thickness of 35 nm was formed on the surface of the metal layer (4) in the same manner as in the above (i) except that the electric power density was changed to 5.2 W/cm$^2$.

Pulse sputtering was carried out using an ITO target (indium:tin=90:10 (mass ratio)) under a pressure of 0.35 Pa at a frequency of 100 kHz at an electric power density of 1 W/cm$^2$ at a reverse pulse duration of 1 μs while introducing an argon with which 3 vol % of an oxygen gas was mixed to form an ITO film with a thickness of 5 nm as a protective film on the surface of the oxide layer (5).

In such a manner, an electroconductive laminate comprising the oxide layers made of AZO and the metal layers made of a gold/silver alloy alternately laminated on the substrate, in a number of the oxide layers of 5 and a number of the metal layers of 4, was obtained. Further, transparent adhesion processing was applied to the electroconductive laminate.

A protective plate in Comparative Example 1 was prepared in the same manner as in Example 1.

Of the protective plate in Comparative Example 1, the luminous transmittance (stimulus Y stipulated in JIS Z 8701) was 61.8% and the luminous reflectance was 4.22%, as measured by color analyzer TC1800 manufactured by Tokyo Denshoku co., Ltd. from the observer side in FIG. 2. Further, the transmittance at a wavelength of 850 nm was 0.3%. The reflection spectrum and the transmission spectrum are shown in FIGS. 5 and 6, respectively.

Further, the sheet resistance (surface resistance) measured by eddy current type resistance measuring apparatus SRM12 manufactured by Nagy was 0.98Ω/□.

The protective plate in Example 1 wherein the first oxide layer 12a contains TZO, the metal layer 12b contains a silver alloy as the main component, and the second oxide layer 12c contains AZO, has a broad transmission/reflection band even though the number of the metal layers is four, and is excellent in electrical conductivity and light transparency.

Whereas, the protective plate in Comparative Example 1 wherein the oxide layer contains AZO and the number of the metal layers is four, has a narrow transmission/reflection band.

INDUSTRIAL APPLICABILITY

The electroconductive laminate of the present invention has excellent electrical conductivity (electromagnetic wave shielding properties), visible light transparency and near infrared shielding properties, and when laminated on a support, provides a broad transmission/reflection band, and is thereby useful as an electromagnetic wave shielding film and a protective plate for a plasma display. Further, the electroconductive laminate of the present invention may be used as a transparent electrode of e.g. a liquid crystal display device, a windshield for an automobile, a heat mirror or electromagnetic wave shielding window glass.

The entire disclosure of Japanese Patent Application No. 2005-040384 filed on Feb. 17, 2005 including specification, claims, drawings and summary is incorporated herein by reference in its entirety.

What is claimed is:

1. An electroconductive laminate comprising:
a substrate; and
an electroconductive film having a three-layer structure having a first oxide layer, a metal layer and a second oxide layer laminated sequentially from the substrate,
wherein the first oxide layer is a layer comprising ZnO and one of TiO$_2$ and Nb$_2$O$_5$ as calculated as oxides in a total amount of at least 90 mass % based on a total mass of the first oxide layer, the metal layer is a layer comprising silver, and the second oxide layer is one layer selected from the group consisting of, as calculated as oxides, a layer comprising ZnO and Al$_2$O$_3$ in a total amount of at least 90 mass % based on a total mass of the second oxide layer, a layer comprising ZnO and Ga$_2$O$_3$ in a total amount of at least 90 mass % based on the total mass of the second oxide layer, a layer comprising In$_2$O$_3$ and SnO$_2$ in a total amount of at least 90 mass % based on the total mass of the second oxide layer, a layer comprising In$_2$O$_3$ and CeO$_2$ in a total amount of at least 90 mass % based on the total mass of the second oxide layer, and a layer comprising SnO$_2$ in an amount of at least 90 mass % based on the total mass of the second oxide layer.

2. The electroconductive laminate according to claim 1, wherein the electroconductive film has the three-layer structure in a multiple of n, where n is an integer of from 2 to 8.

3. The electroconductive laminate according to claim 1, wherein the metal layer is a layer made of pure silver or a silver alloy comprising at least one of gold and bismuth.

4. The electroconductive laminate according to claim 3, wherein the metal layer is a layer made of a silver alloy comprising at least one of gold and bismuth in an amount of from 0.2 to 1.5 mass % in the metal layer.

5. The electroconductive laminate according to claim 1, wherein the second oxide layer is the layer comprising ZnO and Al$_2$O$_3$ as calculated as oxides, and an amount of aluminum is from 1 to 10 at % based on a total amount of aluminum and zinc.

6. The electroconductive laminate according to claim 1, further comprising a protective film on a surface of the electroconductive film.

7. The electroconductive laminate according to claim 6, wherein the protective film is a layer comprising $In_2O_3$ and $SnO_2$ in a total amount of at least 90 mass % based on a total mass of the protective film.

8. An electromagnetic wave shielding film for a plasma display, comprising the electroconductive laminate as defined in claim 1.

9. A protective plate for a plasma display, comprising:
a support;
the electromagnetic wave shielding film for a plasma display as defined in claim 8 formed on the support; and
an electrode electrically in contact with the electroconductive film of the electromagnetic wave shielding film for a plasma display.

10. The protective plate for a plasma display according to claim 9, further comprising an electroconductive mesh film.

* * * * *